United States Patent [19]
Shim et al.

[11] Patent Number: 6,066,523
[45] Date of Patent: *May 23, 2000

[54] METHOD FOR FABRICATING A SEMICONDUCTOR DEVICE HAVING TRIPLE WELLS

[75] Inventors: Dae Yong Shim; Byeong Ryeol Lee, both of Kyoungki-do, Rep. of Korea

[73] Assignee: Hyundai Electronics Industries Co., Ltd., Ichon-shi, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/105,304

[22] Filed: Jun. 26, 1998

[30] Foreign Application Priority Data

Jun. 30, 1997 [KR] Rep. of Korea ................. 97-30205

[51] Int. Cl.⁷ ............................................. H01L 21/8238
[52] U.S. Cl. ..................... 438/228; 438/227; 438/232; 438/450; 438/527
[58] Field of Search ................................. 438/218, 225, 438/227, 228, 229, 231, 232, 450, 451, 527

[56] References Cited

U.S. PATENT DOCUMENTS

| | | |
|---|---|---|
| 5,397,734 | 3/1995 | Iguchi et al. . |
| 5,501,993 | 3/1996 | Borland et al. . |
| 5,693,505 | 12/1997 | Kobayashi .............................. 438/228 |
| 5,753,956 | 5/1998 | Honeycutt et al. ..................... 257/372 |

FOREIGN PATENT DOCUMENTS

5-13717  1/1993  Japan .

*Primary Examiner*—Trung Dang
*Attorney, Agent, or Firm*—Jacobson, Price, Holman & Stern, PLLC

[57] ABSTRACT

The present invention relates to a method for fabricating semiconductor devices having triple wells, the present invention has an effect as follows. The present invention provides carrying out N-well and P-well and R-well ion implantation using a mask for implanting two wells after forming an element isolation oxide film, defining an accurate well region by forming wells having an accurate profile due to activating impurity ions in accordance with the thermal process, and improving the punch characteristic between a well and a well.

20 Claims, 3 Drawing Sheets

METHOD FOR FABRICATING A SEMICONDUCTOR DEVICE HAVING TRIPLE WELLS

BACKGROUND OF THE INVENTION

1. Field of the Invention

The present invention relates to a method for fabricating a semiconductor device having triple wells, and more particularly to a method for fabricating a semiconductor device, in which a triple well accurately defines wells forming a N-well, a P-well, and R-well using an extra ion implantation mask after forming an element isolation oxide film, thereby improving the reliability of an element operation and a process yield in accordance with developing punch characteristics between a well and a well.

2. Discussion of Related Art

The recent trend to fabricate highly integrated semiconductor devices results in forming P- and N-type well regions on a semiconductor substrate and having a triple well structure which forms special well regions in the well regions of different conductive types. For example, it is advantageous that C(complementary)MOS transistors together with P- and N-MOS transistors have a very low power and a fast operative speed.

The method for fabricating a semiconductor device having a conventional triple well structure is described as follows. First, a pad oxide film pattern and a nitride film pattern are formed for isolating elements on a silicon wafer semiconductor substrate, the impurity ions are implanted in the lower portion of the semiconductor substrate exposed by the nitride film pattern in order to form a N-well. Subsequently, an element isolation oxide film is formed on the semiconductor substrate exposed by the nitride film pattern by carrying out a thermal oxidation process, whereas simultaneously N-wells are formed upon diffusing the impurity. High energy ions are implanted and diffused to form a N-well on the semiconductor substrate or a P-well and a R-well in the outer thereof, thereby simultaneously forming P-and R-wells.

As apparent from the above description, when a triple well is formed in the semiconductor device in accordance with the prior art, firstly the ion implantation is performed to form a N-well using a nitride film pattern of an element isolation oxidation mask as a mask, then a P-well and a R-well are formed after diffusing a N-well upon forming an element isolation oxide film.

In the case of performing as above, it is problematic that when the integrated degree of elements increases, a N-well diffused by a thermal oxidation doesn't have effective element isolation characteristics. Furthermore, punch characteristics between a well and a well are weakened, the process yield and the reliability of the element operation are deteriorated since N-well regions aren't defined accurately.

SUMMARY OF THE INVENTION

Accordingly, the present invention is directed to a method for fabricating semiconductor devices having triple wells that substantially obviates one or more of the problems due to limitations and disadvantages of the related art.

An object of the present invention is to provide a method for fabricating semiconductor devices having triple wells, which accurately defines a N-well in accordance with implanting impurity ions for forming triple wells after carrying out an element isolation thermal oxidation process and a diffusing process, and improves a process yield and a reliability of an element operation by developing punch characteristics between a well and a well.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Accordingly, the above objectives may be attained by providing a method for fabricating a semiconductor device having a triple well comprises the steps of: forming an element isolation oxide film on a semiconductor substrate of a first conductive type; forming a first photoresist film pattern on said semiconductor substrate to expose a portion designated as a second conductive type well on said semiconductor substrate; sequentially forming a second conductive type well implantation region, an inter second conductive type well implantation region, and a first conductive type channel deep implantation region upon implanting a second conductive type impurity ions in said exposed portion designated as said second conductive type well of said semiconductor substrate using said first photoresist film pattern as a mask; removing said first photoresist film pattern; forming a second photoresist film pattern on said semiconductor substrate to expose a portion designated as a first conductive type well and a R-well on said semiconductor substrate; sequentially forming a first conductive type well implantation region, an inter first conductive type well implantation region, and a second conductive type channel deep implantation region upon implanting impurity ions of the first conductive type in said exposed portion of said semiconductor substrate using said second photoresist film pattern; removing said second photoresist film pattern; and sequentially forming a first conductive type well, a second conductive type well and a R-well in said semiconductor substrate by activating impurity ions of each implantation region by means of carrying out a thermal process, wherein said first conductive type well is formed in both said second conductive type well and said R-well is said second conductive type well.

In accordance with an aspect of the present invention, a method for fabricating a semiconductor device having a triple well comprises steps of: forming an element isolation oxide film on a semiconductor substrate of a first conductive type; forming a first photoresist film pattern on said semiconductor substrate to expose a portion designated as a second conductive well on said semiconductor substrate; sequentially forming a second conductive type well implantation region, an inter second conductive type well implantation region, and a first conductive type channel deep implantation region upon implanting a second conductive type impurity ions into the exposed portion designated as said second conductive type well of said semiconductor substrate using said first photoresist film pattern as a mask; removing the first photoresist film pattern; forming a second conductive type well upon activating impurities of said second conductive type well implantation region, said inter second conductive type well implantation region, and said first conductive type channel deep implantation region by carrying out a first thermal process on said semiconductor substrate; forming a second photoresist film pattern on said semiconductor substrate to expose a portion designated as a first conductive well and a R-well on said semiconductor substrate; sequentially forming a first conductive type well implantation region, an inter first conductive type well implantation region, and a second conductive type channel deep implantation region upon implanting a first conductive type impurity ions in said exposed portion of said semiconductor substrate using said second photoresist film pattern; removing said second photoresist film pattern; and forming a first conductive type well in both sides of said second conductive type well and a R-well in said second conductive type well by activating impurity ions of the respective implantation regions by means of performing a second thermal process on said semiconductor substrate.

In accordance with an another of the present invention, the present invention provides a method for fabricating a semiconductor device having a triple well comprises steps of: providing a P type semiconductor substrate; sequentially forming a pad oxide film and a nitride film on said semiconductor substrate, and forming a pad oxide film pattern and a nitride film pattern in accordance with a selective removal in order to leave a portion except an element isolation region of said pad oxide film and said nitride film; forming an element isolation oxide film on said element isolation region of said semiconductor substrate, removing said oxide film pattern and nitride film pattern; forming a first photoresist film pattern on said semiconductor substrate to expose a portion designated as a N-type well on the semiconductor substrate; sequentially forming a N-type well implantation region, an inter N-type well implantation region, and a P-type channel deep implantation region upon implanting P impurity ions of a N-type into the exposed portion designated as the N-type well of said semiconductor substrate using said first photoresist film pattern as a mask; removing said first photoresist film pattern; forming N-type wells upon activating impurities of said N-type well implantation region, said inter N-type well implantation region and P-type channel deep implantation region by carrying out a first thermal process on the semiconductor substrate for 10~30 minutes at temperature of 900~1000° C.; forming a second photoresist film pattern to expose a portion designated as the P-type well and R-type well on said semiconductor substrate; forming a P-type well implantation region, an inter P-type well implantation region and a N-type channel deep implantation region upon implanting P-type impurity ions on the exposed semiconductor substrate by use of said second photoresist film pattern; removing said second photoresist film pattern; and simultaneously forming a R-well in said N-type wells and a P-type well in both sides of said N-type well upon activating impurities of the respective implantation regions by carrying out a second thermal process on the semiconductor substrate for 10~30 minutes at temperature of 900~1000° C.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF PREFERRED EMBODIMENT

Hereinafter, a method for fabricating a semiconductor device having a triple well in accordance with the present invention will be explained in detail with reference to the preferred embodiments of the present invention, examples of which are illustrated in the accompanying drawings.

FIGS. 1 to 5 are sectional views respectively illustrating sequential steps of a method for fabricating semiconductor devices having triple wells in accordance with the present invention.

Figure 1:
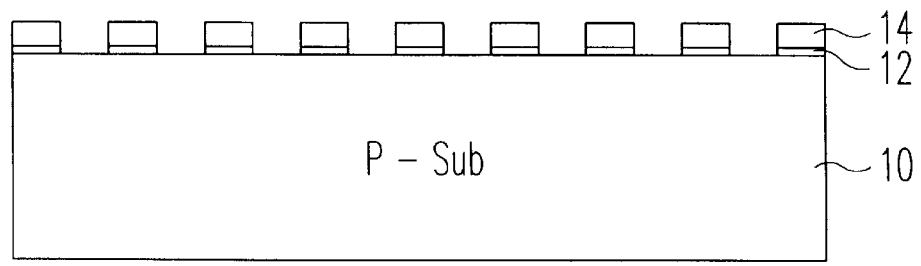
FIGS. 1 to 5 are sectional views respectively illustrating a semiconductor device having a triple well in accordance with the present invention.

With respect to the present invention, a pad oxide film 12 and a nitride film pattern 14 of an element isolation thermal oxidation mask are sequentially formed on a first conductive type, for example, a P-type silicon wafer semiconductor substrate 10 as shown in FIG. 1.

Figure 2:
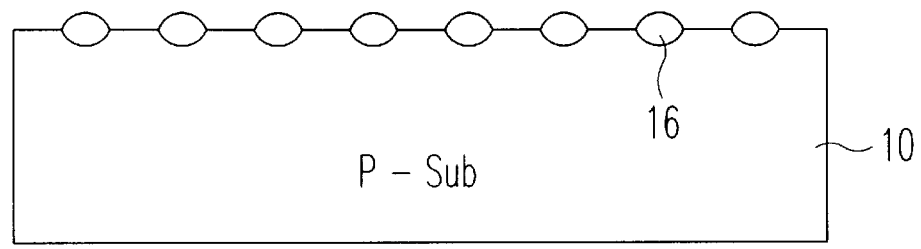

Thereafter, an element isolation oxide film 16 is formed by carrying out a thermal oxidation on the semiconductor substrate 10 exposed by the nitride film pattern 14 as shown in FIG. 2, thereby removing the nitride film pattern 14 and the pad oxide film 12.

Figure 3:
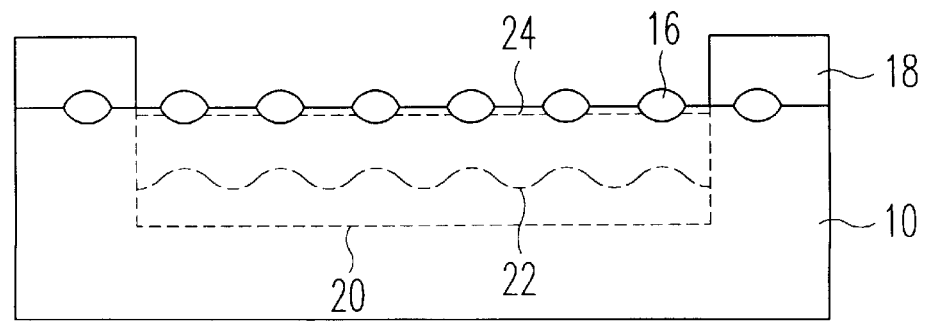

Subsequently, forming a first photoresist film pattern 18 of an ion implantation mask which exposes the portion designated as N-wells in the semiconductor substrate 10, as shown in FIG. 3. Then, a N-well implantation region 20, an inter N-well implantation region 22, and a P-channel deep implantation region 24 are sequentially formed upon implanting a N-type impurity of a second conductive type, for example, P-ions on the exposed semiconductor substrate 10.

The ion implantation processes are carried out in doses of $1.0\text{\textasciitilde}2E13$, $4.0E12\text{\textasciitilde}1.0E13$, $1.0E12\text{\textasciitilde}1.0E13/cm^2$ using the ion implantation energy of $1.0\text{\textasciitilde}3$ MeV, 250~600 KeV, 80~100 KeV respectively. Subsequently, the semiconductor substrate 10 is subjected to a thermal process at a high temperature of 900~1000° C. for 10~30 minutes. As a result, a N-well 40, not shown, is formed upon activating impurity ions implanted at high energy in FIG. 4.

Figure 4:
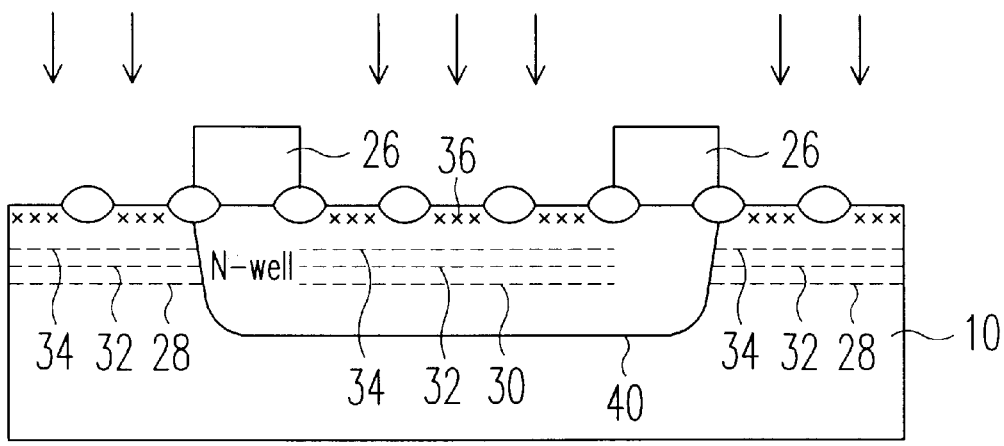

Thereafter, as shown in FIG. 4, the first photoresist film pattern 18 is removed, a second photoresist film pattern 26 of a P-well ion implantation mask is formed on the semiconductor substrate 10.

Subsequently, P-type impurity ions of the first conductive type, for example, Boron impurity ions are implanted into the exposed portion of the semiconductor substrate 10 in a dose of $1.5\text{\textasciitilde}3.0E13/cm^2$ at energy of 400~600 KeV, thereby forming a P-well implantation region 28 in the portion except the N-well 40 of the semiconductor substrate 10, simultaneously a R-well implantation region 30 in the N-well portion 40. Furthermore, P-type impurity ions of the first conductive type, for example, Boron impurity ions are implanted in a dose of $0.5\text{\textasciitilde}1.5E13/cm^2$ at energy of 200~300 KeV, thereby forming an inter P-well implantation region 32 on the N-well portion 40 and the rest portion of the substrate 10, and forming a N-channel deep implantation region 34 using the ion implantation in a dose of $4.0\text{\textasciitilde}6.0E12/cm^2$ at energy of $80^{-120}$ KeV. Further, a N-channel Vt implantation region 36 can be formed by carrying out the ion implantation in a dose of $0.4\text{\textasciitilde}2.0E12/cm^2$ at energy of 20~40 KeV.

The N-channel Vt implantation region 36 can be formed by carrying out the B ion implantation in a dose of $1.0\text{\textasciitilde}4.0E12/cm^2$ at energy of 20~40 KeV on an entire surface of the substrate without an extra mask, not using the second photoresist film pattern as a mask, in this case, the characteristics of a transistor Vt are different as impurity profiles are different from the prior ones.

Figure 5:
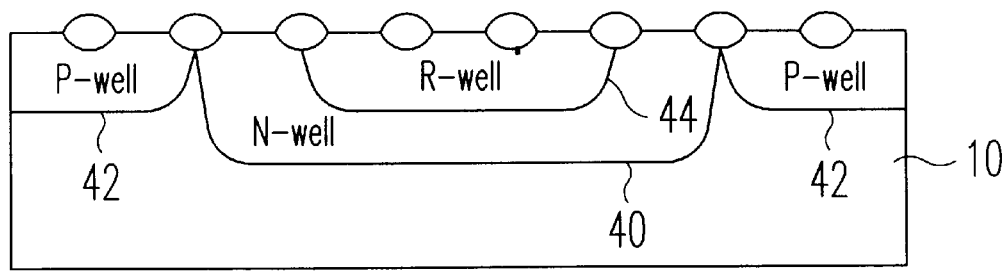

Subsequently, as shown in FIG. 5, removing the second photoresist film pattern 26, complementing damages of the substrate according to the high energy ion implantation upon carrying out a thermal process at high temperature of 900~1000° C. for 10~30 minutes, thereby forming a triple well structure semiconductor device having P-wells 42 in both sides of the N-well 40 and a R-well 44 in the N-well 40 upon simultaneously activating impurity ions of impurity implantation regions.

Figure 6:
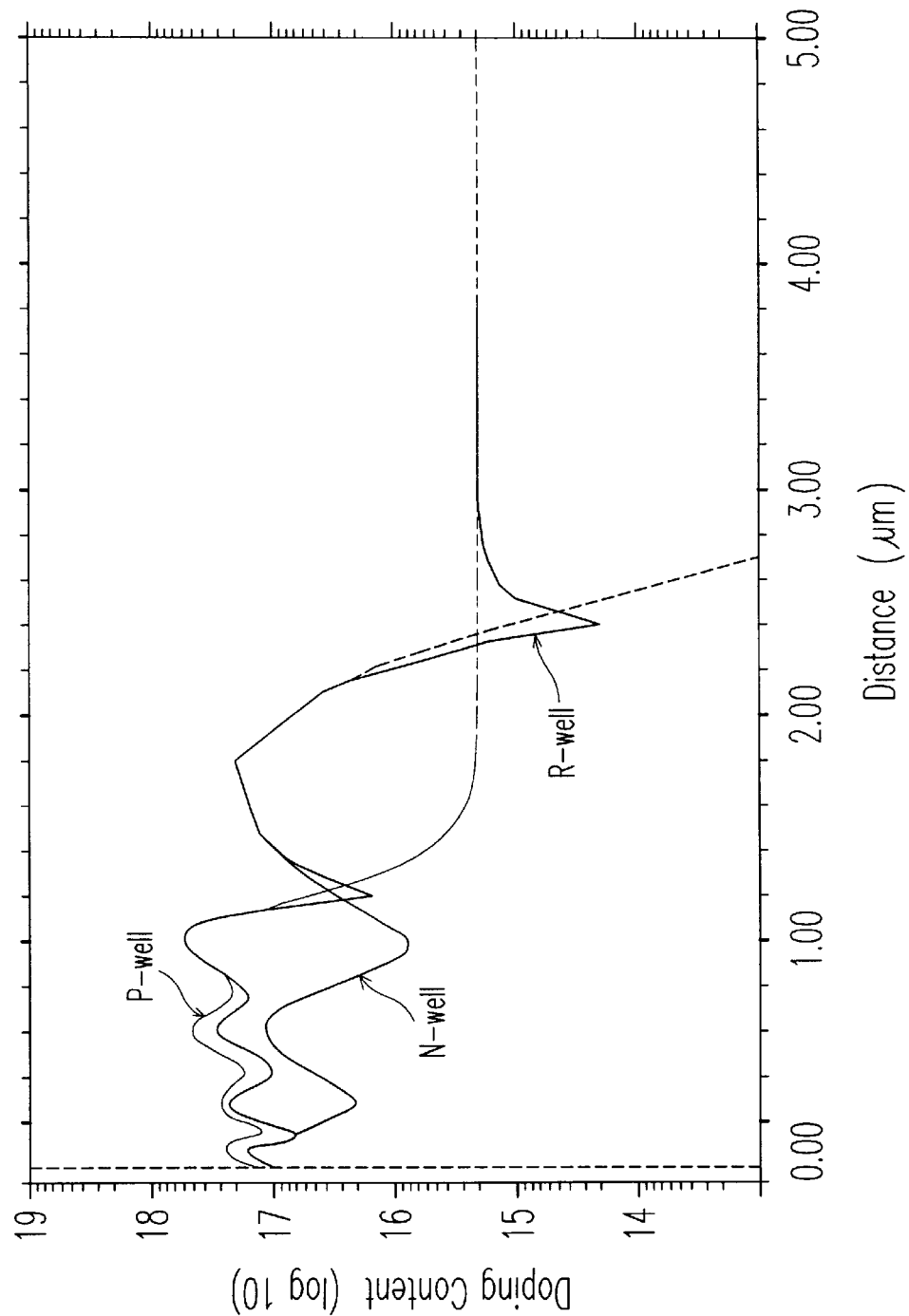
FIG. 6 is a well profile graph along the depth of the semiconductor device in accordance with the present invention.

At that time, the thermal process for forming the N-well can be carried out in order to be activated simultaneously upon the following thermal process without separately performing it. The semiconductor device formed as above has N-well and P-well and R-well profiles as shown in FIG. 6.

As described above, the method for fabricating semiconductor devices having triple wells according to the present invention has an effect as follows. The present invention provides carrying out the N-well, P-well and R-well ion implantation using a mask for implanting two wells after forming an element isolation oxide film, defining an accurate well region by forming wells having an accurate profile due to activating impurity ions in accordance with the thermal process, and improving the punch characteristic between wells.

It will be apparent to those skilled in the art that various modifications and variations can be made in a method for fabricating a semiconductor device having a triple well of the present invention without departing from the spirit or scope of the invention. Thus, it is intended that the present invention cover the modifications and variations of this invention provided they come within the scope of the appended claims and their equivalents.

What ia claimed is:

1. A method for fabricating a semiconductor device having a triple well, comprising steps of:

forming an element isolation oxide film on a semiconductor substrate of a first conductive type;

forming a first photoresist film pattern on said semiconductor substrate to expose a portion designated as a second conductive type well on said semiconductor substrate;

sequentially forming a second conductive type well implantation region, an inter second conductive type well implantation region, and a first conductive type channel deep implantation region upon implanting a second conductive type impurity ions in said exposed portion designated as said second conductive type well of said semiconductor substrate using said first photoresist film pattern as a mask;

removing said first photoresist film pattern;

forming a second photoresist film pattern on said semiconductor substrate to expose a portion designated as a first conductive type well and a R-well on said semiconductor substrate;

sequentially forming a first conductive type well implantation region, an inter first conductive type well implantation region, and a second conductive type channel deep implantation region upon implanting impurity ions of the first conductive type in said exposed portion of said semiconductor substrate using said second photoresist film pattern;

removing said second photoresist film pattern; and sequentially forming a first conductive type well, a second conductive type well and a R-well in said semiconductor substrate by activating impurity ions of each implantation region by means of carrying out a thermal process, wherein said first conductive type well is formed in both said second conductive type well and said R-well is said second conductive type well.

2. The method according to claim 1, wherein said first and second conductive types are opposite to each other, they are P-and N-types, respectively.

3. The method according to claim 1, wherein said first and second conductive type impurities are P, and B respectively.

4. The method according to claim 3, wherein said second conductive type well implantation region, said inter second conductive type well implantation region, and said first conductive type channel deep implantation region are respectively formed upon implanting ions in doses of 1.0~2E13/cm², 4.0E12~1.0E13/cm², 1.0E12~1.0E13/cm² at energy of ion implantation of 1.0~3 MeV, 250~600 KeV, 80~100 KeV.

5. The method according to claim 3, wherein said first conductive type well implantation region, said inter first conductive type well implantation region and said second conductive type channel deep implantation region are respectively formed upon implanting ions in doses of 1.5~3.0E13/cm², 0.5~1.5E13/cm², 4.0~6.0E12/cm² at energy of ion implantation of 400~600 KeV, 200~300 KeV, 80~~120 KeV.

6. The method according to claim 1, wherein further comprises a step of forming a second conductive type channel Vt implantation region upon implanting Boron impurity of said first conductive type into the exposed portion of the semiconductor substrate in a dose of 0.4~2.0E12/cm² at energy of ion implantation of 20~40 KeV prior to removing said second photoresist film pattern.

7. The method according to claim 1, wherein further comprises a step of forming a second conductive type channel Vt implantation region upon implanting Boron impurity of the first conductive type into the entire surface of the semiconductor substrate in a dose of 1.0~4.0E12/cm² at energy of ion implantation of 20~40 KeV after removing said second photoresist film pattern.

8. The method according to claim 1, wherein said thermal process is carried out for 10~30 minutes at temperature of 900~1000° C.

9. The method according to claim 1, wherein said thermal process is carried out once more after removing said first photoresist film pattern.

10. A method for fabricating a semiconductor device having a triple well, comprising steps of:

forming an element isolation oxide film on a semiconductor substrate of a first conductive type;

forming a first photoresist film pattern on said semiconductor substrate to expose a portion designated as a second conductive well on said semiconductor substrate;

sequentially forming a second conductive type well implantation region, an inter second conductive type well implantation region, and a first conductive type channel deep implantation region by implanting a second conductive type impurity ions into the exposed portion designated as said second conductive type well of said semiconductor substrate using said first photoresist film pattern as a mask;

removing the first photoresist film pattern;

forming a second conductive type well in said semiconductor substrate by activating impurities of said second conductive type well implantation region, said inter second conductive type well implantation region, and said first conductive type channel deep implantation region by carrying out a first thermal process;

forming a second photoresist film pattern on said semiconductor substrate to expose a portion designated as a first conductive well and a R-well on said semiconductor substrate;

sequentially forming a first conductive type well implantation region, an inter first conductive type well implantation region, and a second conductive type channel deep implantation region upon implanting a first conductive type impurity ions in said exposed portion of said semiconductor substrate using said second photoresist film pattern;

removing said second photoresist film pattern; and forming a first conductive type well in both sides of said second conductive type well and a R-well in said second conductive type well by activating impurity ions of the respective implantation regions by means of performing a second thermal process.

11. The method according to claim 10, wherein said second conductive type well implantation region, said inter second conductive type well implantation region, and said first conductive type channel deep implantation region are respectively formed upon implanting ions in doses of $1.0~2E13/cm^2$, $4.0E12~1.0E13/cm^2$, $1.0E12~1.0E13/cm^2$ at energy of ion implantation of $1.0~3$ MeV, $250~600$ KeV, $80~100$ KeV.

12. The method according to claim 10, wherein said first conductive type well implantation region, said inter first conductive type well implantation region, and said second conductive type channel deep implantation region are respectively formed upon implanting ions in doses of $1.5~3.0E13/cm^2$, $0.5~1.5E13/cm^2$, $4.0~6.0E12/cm^2$ at energy of ion implantation of $400~600$ KeV, $200~300$ KeV, $80~120$ KeV.

13. The method according to claim 10, wherein further comprises a step of forming a second conductive type channel Vt implantation region upon implanting impurities of the first conductive type into the exposed portion of the semiconductor substrate in a dose of $0.4~2.0E12/cm^2$ at energy of ion implantation of $20~40$ KeV prior to removing said second photoresist film pattern.

14. The method according to claim 10, wherein further comprises a step of forming a second conductive type channel Vt implantation region upon implanting impurities of the first conductive type on the entire surface of the semiconductor substrate in a dose of $1.0~4.0E12/cm^2$ at energy of ion implantation of $20~40$ KeV after removing said second photoresist film pattern.

15. The method according to claim 12, wherein said first and second thermal processes are carried out for $10~30$ minutes at temperature of $900~1000°$ C.

16. A method for fabricating a semiconductor device having a triple well, comprising steps of:

providing a P type semiconductor substrate;

sequentially forming a pad oxide film and a nitride film on said semiconductor substrate, and forming a pad oxide film pattern and a nitride film pattern in accordance with a selective removal in order to leave a portion except an element isolation region of said pad oxide film and said nitride film;

forming an element isolation oxide film on said element isolation region of said semiconductor substrate, removing said oxide film pattern and nitride film pattern;

forming a first photoresist film pattern on said semiconductor substrate to expose a portion designated as a N-type well on the semiconductor substrate;

sequentially forming a N-type well implantation region, an inter N-type well implantation region, and a P-type channel deep implantation region in said semiconductor substrate by implanting P impurity ions of a N-type into the exposed portion designated as the N-type well of said semiconductor substrate using said first photoresist film pattern as a mask;

removing said first photoresist film pattern;

forming N-type wells by activating impurities of said N-type well implantation region, said inter N-type well implantation region and P-type channel deep implantation region by carrying out a first thermal process for $10~30$ minutes at temperature of $900~1000°$ C.;

forming a second photoresist film pattern to expose a portion designated as the P-type well and R-type well on said semiconductor substrate;

forming a P-type well implantation region, an inter P-type well implantation region and a N-type channel deep implantation region by implanting P-type impurity ions on the exposed semiconductor substrate by use of said second photoresist film pattern;

removing said second photoresist film pattern; and simultaneously forming a R-well in said N-type wells and a P-type well in both sides of said N-type well by activating impurities of the respective implantation regions by means of carrying out a second thermal process for $10~30$ minutes at temperature of $900~1000°$ C.

17. The method according to claim 16, wherein said N-type well implantation region, said inter N-type well implantation region, and said P-type channel deep implantation region are respectively formed upon implanting ions in doses of $1.0~2E13/cm^2$, $4.0E12~1.0E13/cm^2$, $1.0E12~1.0E13/cm^2$ at energy of ion implantation of $1.0~3$ MeV, $250~600$ KeV, $80~100$ KeV.

18. The method according to claim 16, wherein said P-type well implantation region, said inter P-type well implantation region, and said N-type channel deep implantation region are respectively formed upon implanting ions in doses of $1.5~3.0E13/cm^2$, $0.5~1.5E13/cm^2$, $4.0~6.0E12/cm^2$ at energy of ion implantation of $400~600$ KeV, $200~300$ KeV, $80~120$ KeV.

19. The method according to claim 16, wherein further comprises a step of forming a N-type channel Vt implantation region upon implanting Boron impurity of P-type into the exposed semiconductor substrate in a dose of $0.4~2.0E12/cm^2$ at energy of ion implantation of $20~40$ KeV prior to removing said second photoresist film pattern.

20. The method according to claim 16, wherein further comprises a step of forming said N-type channel Vt implantation region upon implanting Boron impurity of P-type into the entire surface of the semiconductor substrate in a dose of $1.0~4.0E12/cm^2$ at energy of ion implantation of $20~40$ KeV after removing said second photoresist film pattern.

* * * * *